(12) United States Patent  
Orikasa et al.

(10) Patent No.: US 10,968,519 B2  
(45) Date of Patent: *Apr. 6, 2021

(54) SHEET MATERIAL, METAL MESH, WIRING SUBSTRATE, DISPLAY DEVICE AND MANUFACTURING METHODS THEREFOR

(71) Applicant: TDK CORPORATION, Tokyo (JP)

(72) Inventors: Makoto Orikasa, Tokyo (JP); Yuhei Horikawa, Tokyo (JP); Yoshihiro Kanbayashi, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 74 days.

This patent is subject to a terminal disclaimer.

(21) Appl. No.: 16/046,359

(22) Filed: Jul. 26, 2018

(65) Prior Publication Data

US 2019/0032219 A1 Jan. 31, 2019

(30) Foreign Application Priority Data

Jul. 27, 2017 (JP) .............................. JP2017-145731

(51) Int. Cl.
*C23C 18/16* (2006.01)
*C23C 18/32* (2006.01)
(Continued)

(52) U.S. Cl.
CPC ............ *C23C 18/1641* (2013.01); *B32B 3/30* (2013.01); *B32B 15/09* (2013.01); *B32B 15/20* (2013.01); *B32B 27/08* (2013.01); *B32B 27/18* (2013.01); *B32B 27/36* (2013.01); *C23C 18/161* (2013.01); *C23C 18/1608* (2013.01); *C23C 18/1651* (2013.01); *C23C 18/30* (2013.01); *C23C 18/32* (2013.01); *C23C 18/38* (2013.01);
(Continued)

(58) Field of Classification Search
CPC . C23C 18/1641; C23C 18/30; C23C 18/1608; C23C 18/161; C23C 18/38; C23C 18/32; C23C 18/1651; C23C 18/31; C23C 18/2006; C23C 18/1689; C23C 18/165; B32B 27/18; B32B 3/30; B32B 15/20; B32B 15/09; B32B 27/36; B32B 27/08; B32B 2457/20; B32B 2307/412; H01L 27/156; H01L 23/52; H01L 25/0753; H01L 23/145; H01L 33/62; H01L 23/498; C23F 1/02; G09F 9/33
See application file for complete search history.

(56) References Cited

U.S. PATENT DOCUMENTS 9,070,393 B2 * 6/2015 Yoshioka ............... G11B 5/486
2007/0065639 A1   3/2007 Iida et al.
(Continued)

FOREIGN PATENT DOCUMENTS

CN    101578392 A    11/2009
JP    2007-087979 A   4/2007
(Continued)

*Primary Examiner* — Nathan L Van Sell
(74) *Attorney, Agent, or Firm* — Oliff PLC

(57) ABSTRACT

A sheet material includes a resin layer containing a binder and catalyst particles, an electroless plating film on the side of one main surface of the resin layer and including first electroless plating films and a second electroless plating film, and a base material on the side of the other main surface of the resin layer.

2 Claims, 7 Drawing Sheets

(51) Int. Cl.
| | |
|---|---|
| *C23C 18/38* | (2006.01) |
| *B32B 27/08* | (2006.01) |
| *B32B 27/36* | (2006.01) |
| *B32B 15/09* | (2006.01) |
| *B32B 15/20* | (2006.01) |
| *B32B 3/30* | (2006.01) |
| *H01L 23/52* | (2006.01) |
| *H01L 27/15* | (2006.01) |
| *B32B 27/18* | (2006.01) |
| *C23C 18/30* | (2006.01) |
| *H01L 23/498* | (2006.01) |
| *C23F 1/02* | (2006.01) |
| *H01L 33/62* | (2010.01) |
| *H01L 23/14* | (2006.01) |
| *H01L 25/075* | (2006.01) |

(52) U.S. Cl.
CPC ............ H01L 23/52 (2013.01); H01L 27/156 (2013.01); *B32B 2307/412* (2013.01); *B32B 2457/20* (2013.01); *C23F 1/02* (2013.01); *H01L 23/145* (2013.01); *H01L 23/498* (2013.01); *H01L 25/0753* (2013.01); *H01L 33/62* (2013.01)

(56) References Cited

U.S. PATENT DOCUMENTS

| | | | |
|---|---|---|---|
| 2011/0139494 A1* | 6/2011 | Yu | H05K 3/107 |
| | | | 174/255 |
| 2017/0169930 A1* | 6/2017 | Kudo | H01F 27/292 |

FOREIGN PATENT DOCUMENTS

| | | |
|---|---|---|
| JP | 2011-194824 A | 10/2011 |
| JP | 2013-010884 A | 1/2013 |
| JP | 2014-150118 A | 8/2014 |
| JP | 2015-229260 A | 12/2015 |
| JP | 2016-074582 A | 5/2016 |
| JP | 2016-221971 A | 12/2016 |

* cited by examiner

SHEET MATERIAL, METAL MESH, WIRING SUBSTRATE, DISPLAY DEVICE AND MANUFACTURING METHODS THEREFOR

TECHNICAL FIELD

The present invention relates to a sheet material, a metal mesh, a wiring substrate, and a display device and manufacturing methods therefor.

BACKGROUND

In recent years, an attempt to develop a metal mesh obtained by patterning a fine wiring of a metal such as copper or silver into a mesh shape as an electrode member used for an electronic component such as a touch panel has been made.

The metal mesh is more excellent in that reduction in cost and reduction in resistance can be implemented than when a conventional transparent conductive film such as an ITO (indium tin oxide) film is used. However, when the metal mesh is used as the electrode member used for the touch panel or the like, invisibility of the metal mesh becomes more problematic than that of the ITO film.

As the metal mesh the invisibility of which has been improved, a metal mesh consisting of a copper layer and a blackening metal layer has been known. For example, PTL 1 and PTL 2 disclose a metal mesh using a metal oxide or the like lower in corrosion speed than copper and a metal mesh using a zinc layer, for example, as the blackening metal layer.

PTL 3 describes a film-bearing glass plate in which a stacked film obtained by stacking a plurality of films is formed on a glass plate and the stacked film includes an inorganic film containing at least a noble metal formed on the glass plate and a plating metal film formed on the inorganic film. According to PTL3, the stacked film is black when viewed from the side of the glass plate.

CITATION LIST

Patent Literature

[PTL 1] Japanese Unexamined Patent Publication No. 2014-150118
[PTL 2] Japanese Unexamined Patent Publication No. 2015-229260
[PTL 3] Japanese Unexamined Patent Publication No. 2016-74582

SUMMARY

In the metal mesh described in each of PTL 1 and PTL 2, a black surface can be formed by providing a blackening metal layer. Accordingly, invisibility of the metal mesh can be improved to some extent. However, examination made by the inventors has indicated that there is still room for improvement in even the metal mesh from the viewpoint of a high reflectance.

In the film-bearing glass plate described in PTL 3, an adhesive property between the glass plate and the stacked film has been difficult to enhance.

The present invention has been made in view of the above-described circumstances and is directed to suppressing a reflectance while improving an adhesive property between a base material and a plating film with respect to a metal mesh formed of the plating film provided on the base material, a sheet material for manufacturing the metal mesh, and a wiring substrate and a display device using the sheet material.

The present invention provides a sheet material comprising a resin layer containing a binder and a plurality of catalyst particles, an electroless plating film provided on the side of one main surface of the resin layer and including first electroless plating films and a second electroless plating film, and a base material provided on the side of the other main surface of the resin layer. At least some of the plurality of catalyst particles respectively have exposure surfaces exposed from the one main surface of the resin layer, and the plurality of exposure surfaces are scattered on the one main surface of the resin layer. The first electroless plating films are provided on the one main surface of the resin layer to respectively surround the plurality of exposure surfaces of the catalyst particles. The second electroless plating film is provided to cover the first electroless plating films, and a main surface, on the side of the first electroless plating films, of the second electroless plating film forms concave portions, respectively, along surfaces of the first electroless plating films.

In the sheet material according to the present invention, a reflectance can be suppressed while an adhesive property between the base material and the plating film can be enhanced.

When the one main surface of the resin layer is viewed in a planar view from the side of the electroless plating film, an average value of respective longest diameter of the first electroless plating films may be 18 to 90 nm, and an area ratio of the first electroless plating films to the one main surface may be 80 to 99%.

A main surface, on the opposite side to the first electroless plating films, of the second electroless plating film may be a rough surface.

The base material may be a transparent base material.

The present invention also provides a method for manufacturing the above-described sheet material according to the present invention. A method for manufacturing a sheet material according to the present invention comprises a step of forming a resin layer containing a binder and a plurality of catalyst particles on a base material, at least some of the plurality of catalyst particles respectively having exposure surfaces exposed from one main surface of the resin layer, the plurality of exposure surfaces being scattered on the one main surface of the resin layer, and the base material being provided on the side of the other main surface of the resin layer, a step of forming first electroless plating films on the one main surface of the resin layer to respectively surround the plurality of exposure surfaces, and a step of forming a second electroless plating film to cover the first electroless plating films, a main surface, on the side of the first electroless plating films, of the second electroless plating film forming concave portions, respectively, along surfaces of the first electroless plating films.

The present invention further provides a method for manufacturing a metal mesh, comprising a step of performing etching for the electroless plating film in the above-described sheet material according to the present invention to form an electroless plating film having a mesh-shaped pattern.

The present invention further provides a method for manufacturing a wiring substrate, comprising a step of performing etching for the electroless plating film in the above-described sheet material according to the present invention to form an electroless plating film having a wiring pattern.

As an aspect of a metal mesh, the present invention provides a metal mesh (which may be hereinafter referred to as a "first metal mesh" for convenience) comprising a resin layer containing a binder and a plurality of catalyst particles, an electroless plating film provided to form a mesh-shaped pattern on the side of one main surface of the resin layer and including first electroless plating films and a second electroless plating film, and a base material provided on the side of the other main surface of the resin layer. In the first metal mesh, at least some of the plurality of catalyst particles respectively have exposure surfaces exposed from the one main surface of the resin layer, and the plurality of exposure surfaces are scattered on the one main surface of the resin layer. The first electroless plating films are provided on the one main surface of the resin layer to respectively surround the plurality of exposure surfaces of the catalyst particles. The second electroless plating film is provided to cover the first electroless plating films, and a main surface, on the side of the first electroless plating films, of the second electroless plating film forms concave portions, respectively, along surfaces of the first electroless plating films.

As another aspect of a metal mesh, the present invention provides a metal mesh (which may be hereinafter referred to as a "second metal mesh" for convenience) comprising a base material, a resin layer provided to form a mesh-shaped pattern on the base material and containing a binder and a plurality of catalyst particles, and an electroless plating film provided on the base material along the mesh-shaped pattern of the resin layer while covering the resin layer and including first electroless plating films and a second electroless plating film. In the second metal mesh, at least some of the plurality of catalyst particles respectively have exposure surfaces exposed from a surface of the resin layer, and the plurality of exposure surfaces are scattered on the surface of the resin layer. The first electroless plating films are provided on the surface of the resin layer to respectively surround the plurality of exposure surfaces of the catalyst particles. The second electroless plating film is provided to cover the first electroless plating films, and a surface, on the side of the first electroless plating films, of the second electroless plating film fours concave portions, respectively, along surfaces of the first electroless plating films.

In the above-described metal mesh according to the present invention, a reflectance can be suppressed while an adhesive property between the base material and the plating film can be enhanced.

In the above-described metal mesh, a surface, on the opposite side to the first electroless plating films, of the second electroless plating film may be a rough surface.

As an aspect of a wiring substrate, the present invention further provides a wiring substrate (which may be hereinafter referred to as a "first wiring substrate" for convenience) comprising a resin layer containing a binder and a plurality of catalyst particles, an electroless plating film provided to form a wiring pattern on the side of one main surface of the resin layer and including first electroless plating films and a second electroless plating film, and a base material provided on the side of the other main surface of the resin layer. In the first wiring substrate, at least some of the plurality of catalyst particles respectively have exposure surfaces exposed from the one main surface of the resin layer, and the plurality of exposure surfaces are scattered on the one main surface of the resin layer. The first electroless plating films are provided on the one main surface of the resin layer to respectively surround the plurality of exposure surfaces of the catalyst particles. The second electroless plating film is provided to cover the first electroless plating films, and a main surface, on the side of the first electroless plating films, of the second electroless plating film forms concave portions, respectively, along surfaces of the first electroless plating films.

As another aspect of a wiring substrate, the present invention provides a wiring substrate (which may be hereinafter referred to as a "second wiring substrate" for convenience) comprising a base material, a resin layer provided to form a wiring pattern on the base material and containing a binder and a plurality of catalyst particles, and an electroless plating film provided on the base material along the wiring pattern of the resin layer while covering the resin layer and including first electroless plating films and a second electroless plating film. In the second wiring substrate, at least some of the plurality of catalyst particles respectively have exposure surfaces exposed from the surface of the resin layer, and the plurality of exposure surfaces are scattered on the surface of the resin layer. The first electroless plating films are provided on the surface of the resin layer to respectively surround the plurality of exposure surfaces of the catalyst particles. The second electroless plating film is provided to cover the first electroless plating films, and a surface, on the side of the first electroless plating films, of the second electroless plating film fauns concave portions, respectively, along surfaces of the first electroless plating films.

The present invention further provides a method for manufacturing a display device, comprising a step of mounting a light emitting element on the above-described wiring substrate according to the present invention. The mounting step may comprise forming a connection section on a main surface, on the opposite side to the resin layer, of the electroless plating film in the wiring substrate, and connecting the light emitting element to the electroless plating film with the connection section interposed therebetween.

The present invention further provides a display device comprising the above-described wiring substrate according to the present invention, and a light emitting element mounted on the wiring substrate. The display device may further comprise a connection section provided on a main surface, on the opposite side to the resin layer, of the electroless plating film in the wiring substrate, and the light emitting element may be connected to the wiring substrate with the connection section interposed therebetween.

According to the present invention, there can be provided a sheet material in which a reflectance can be suppressed while an adhesive property between a base material and a plating film is high and a manufacturing method therefor. According to the present invention, there can be provided a metal mesh and a wiring substrate each having a similar effect to that of the above-described sheet material, and respective manufacturing methods therefor.

Furthermore, the present invention can also provide a display device in which a reflectance can be suppressed while an adhesive property between a base material and a plating film is high, and a manufacturing method therefor. In recent years, a display device (e.g., an LED display) including a light emitting element such as a light emitting diode (LED) has been developed. In a liquid crystal display (LCD), light from a backlight is controlled by a transmissive liquid crystal. On the other hand, in the LED display, a pixel is formed using the light emitting diode as a natural light emitting element. Accordingly, the LED display has features such as a high luminance, a long life, and a wide viewing angle.

In the display device including the light emitting element, the light emitting element itself may be made small to improve its resolution. However, the smaller the light emitting element becomes, the more difficult it becomes to mount the light emitting element on a substrate while enhancing an adhesive property therebetween. When a wiring substrate according to the present invention is used as an electrode member, and a fine light emitting element is mounted thereon, a flexible and high-resolution display device can be obtained. Further, a display device in which an adhesive property between a base material and a plating film in a wiring substrate is high and an adhesive property between a light emitting element and the wiring substrate is also excellent even if the light emitting element is small can be easily manufactured.

DETAILED DESCRIPTION

Figure 1:
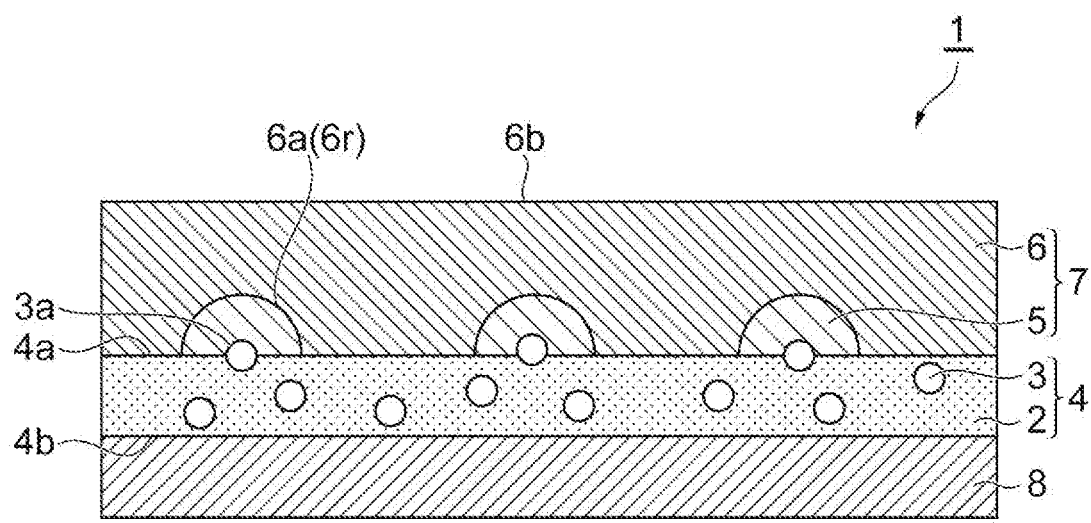
FIG. 1 is a schematic sectional view illustrating an embodiment of a sheet material.

Preferred embodiments of the present invention will be described in detail below with reference to the drawings.
[Sheet Material]
FIG. 1 is a schematic sectional view illustrating an embodiment of a sheet material. As illustrated in FIG. 1, a sheet material 1 according to the present embodiment includes a resin layer 4 containing a binder 2 and a plurality of catalyst particles 3, an electroless plating film 7 provided on the side of one main surface 4a of the resin layer 4 and including first electroless plating films 5 and a second electroless plating film 6, and a base material 8 provided on the side of the other main surface 4b of the resin layer 4. Some of the plurality of catalyst particles 3 respectively have exposure surfaces 3a exposed from the one main surface 4a of the resin layer 4, and the plurality of exposure surfaces 3a are scattered on the one main surface 4a of the resin layer 4. The first electroless plating films 5 are provided on the one main surface 4a of the resin layer 4 to respectively surround the plurality of exposure surfaces 3a of the plurality of catalyst particles 3, the second electroless plating film 6 is provided to cover the first electroless plating films 5, and a main surface 6a, on the side of the first electroless plating films 5, of the second electroless plating film 6 forms concave portions 6r, respectively, along surfaces of the first electroless plating films 5.

The above-described sheet material 1 enables a reflectance to be suppressed while enabling an adhesive property between the base material and the plating film to be enhanced when used to manufacture a metal mesh. The inventors presumes the reason why such an effect is obtained, as follows.

First, it is considered that the reason why a reflectance cannot be kept low in a conventional metal mesh provided with a blackening metal layer is that the blackening metal layer uniformly exists, i.e., a large part of the blackening metal layer has a smooth surface. On the other hand, in the sheet material 1 according to the present invention, the first electroless plating films 5 are provided on the one main surface 4a of the resin layer 4 to respectively surround the exposure surfaces 3a of the plurality of catalyst particles 3. Accordingly, there are few regions each having a smooth surface, whereby it is presumed that a reflectance can be kept low. In addition, the electroless plating film 7 and the base material 8 are stacked with the resin layer 4 interposed therebetween, whereby it is considered that an adhesive property between the electroless plating film 7 and the base material 8 can be enhanced.

Examples of the binder 2 include acrylic resin, amino resin, cyanate resin, isocyanate resin, polyimide resin, epoxy resin, oxetane resin, polyester, allyl resin, phenol resin, benzooxazine resin, xylene resin, ketone resin, furan resin, COPNA (condensed polynuclear aromatic) resin, silicon resin, dichloropentadiene resin, benzocyclobutene resin, episulfide resin, ene-thiol resin, polyazomethine resin, a polyvinyl benzyl ether compound, acenaphthylene, and ultraviolet curable resin containing an unsaturated double bond or a functional group causing polymerization reaction with ultraviolet rays such as cyclic ether or vinyl ether.

Examples of the catalyst particles 3 include metal particles containing at least one type of metal selected from a group consisting of palladium, silver, platinum, gold, nickel, copper, and their compounds. When the metal particles are used as the catalyst particles 3, an adhesive property between the catalyst particles 3 and the first electroless plating films 5, described below, can be further improved while the respective longest diameters of the first electroless plating films 5 and an area ratio of the first electroless plating films 5 to the one main surface 4a of the resin layer 4 can be respectively efficiently adjusted to desired values. It is preferable for the catalyst particles 3 to have an average particle diameter of 10 to 100 nm. If the average particle diameter of the catalyst particles 3 is in the above-described numerical range, the reflectance can be more effectively suppressed when the sheet material and the metal mesh are produced. The average particle diameter is measured by a laser diffraction scattering method, and can be calculated as a value corresponding to a particle diameter at a cumulative volume of 50% when a cumulative volume particle size distribution curve is drawn from the side of a small particle diameter.

Although a mass ratio of the binder 2 and the catalyst particles 3 in the resin layer 4 is not particularly limited, it is preferable that a mass ratio of the binder to the catalyst particles be 2:1 to 50:1, for example, from the viewpoint of more effectively suppressing the reflectance. Although the thickness of the resin layer 4 is not particularly limited, it is preferable that the thickness be 10 to 100 nm, for example, from the viewpoint of more effectively suppressing the reflectance.

It is preferable for the first electroless plating film 5 to contain at least one type of metal selected from a group consisting of nickel, palladium, gold, silver, and their compounds from the viewpoint of effectively suppressing the reflectance to more exhibit invisibility and from the viewpoint of ensuring a favorable etching property (preventing disconnection by excessive etching) when the electroless plating film 7 is patterned by etching. It is more preferable for the first electroless plating film 5 to further contain phosphorous from the viewpoint of more effectively ensuring the above-described etching property. The content of phosphorous in this case may be 8% by mass or less of the total mass of the first electroless plating films 5.

It is preferable that an average value of the respective longest diameters of the first electroless plating films 5 be 18 to 90 nm when the one main surface 4a of the resin layer 4 is viewed in a planar view from the side of the electroless plating film 7. If the average value of the respective longest diameters of the first electroless plating films 5 is 18 mm or more, the reflectance can be more effectively suppressed by the first electroless plating films 5. If the average value is 90 nm or less, regions each having a smooth surface in the first electroless plating films 5 can be fewer, and as a result the reflectance can be more effectively suppressed.

It is preferable that the area ratio of the first electroless plating films 5 to the one main surface 4a of the resin layer 4 be 80 to 99% when the one main surface 4a of the resin layer 4 is viewed in a planar view from the side of the electroless plating film 7. If the area ratio is 80% or more, the reflectance can be more effectively suppressed by the first electroless plating films 5. If the area ratio is 99% or less, regions each having a smooth surface in the first electroless plating films 5 can be fewer, and as a result the reflectance can be more effectively suppressed.

The average value of the respective longest diameters of the first electroless plating films 5 and the area ratio of the first electroless plating films 5 to the one main surface 4a of the resin layer 4 can be measured by image analysis of an SEM (scanning electron microscope) picture. More specifically, the average value of the respective longest diameters of the first electroless plating films 5 can be calculated by observing the sheet material 1 at a magnification of 200000 times from the side of the electroless plating film 7, acquiring an image of the SEM picture in a field of view which is 500 μm in length and 600 μm in width, actually measuring the respective longest diameters of the first electroless plating films 5 in the field of view, and averaging respective actual measurement values. The area ratio can be found by measuring the respective areas of the first electroless plating films 5 from the respective longest diameters and shortest diameters of the first electroless plating films 5 within the field of view and calculating a ratio of a total value of the areas to the area of the field of view.

It is preferable for the second electroless plating film 6 to contain at least one type of metal selected from a group consisting of copper, nickel, silver, and their compounds and it is more preferable for the second electroless plating film 6 to contain copper from the viewpoint of reducing an electrical resistance. Although the first electroless plating films 5 and the second electroless plating film 6, described above, may contain metals or metal compounds of the same type or different types, it is preferable for the first electroless plating films 5 and the second electroless plating film 6 to respectively contain metals or metal compounds of different types and it is more preferable for the first electroless plating films 5 to contain nickel or a nickel compound and the second electroless plating film 6 contains copper.

Although the thickness of the second electroless plating film 6 is not particularly limited, it is preferable that the thickness be 0.3 to 10 μm and it is more preferable that the thickness be 0.5 to 10 μm, for example, from the viewpoint of more effectively suppressing the reflectance. Particularly, if the thickness of the second electroless plating film 6 is 0.3 μm or more, continuity of the second electroless plating film 6 can be more effectively maintained.

The base material 8 may be a transparent base material, although not particularly limited. It is preferable for the base material 8 to contain at least one type of metal selected from a group consisting of polyethylene terephthalate (PET), polyethylene naphthalate, and polyimide from the viewpoint of easily obtaining a sheet material having a high transmittance and having a low reflectance. Although the thickness of the base material 8 is not particularly limited, it is preferable that the thickness be 3 to 50 μm, for example, from the viewpoint of more effectively suppressing the reflectance.

Figure 2:
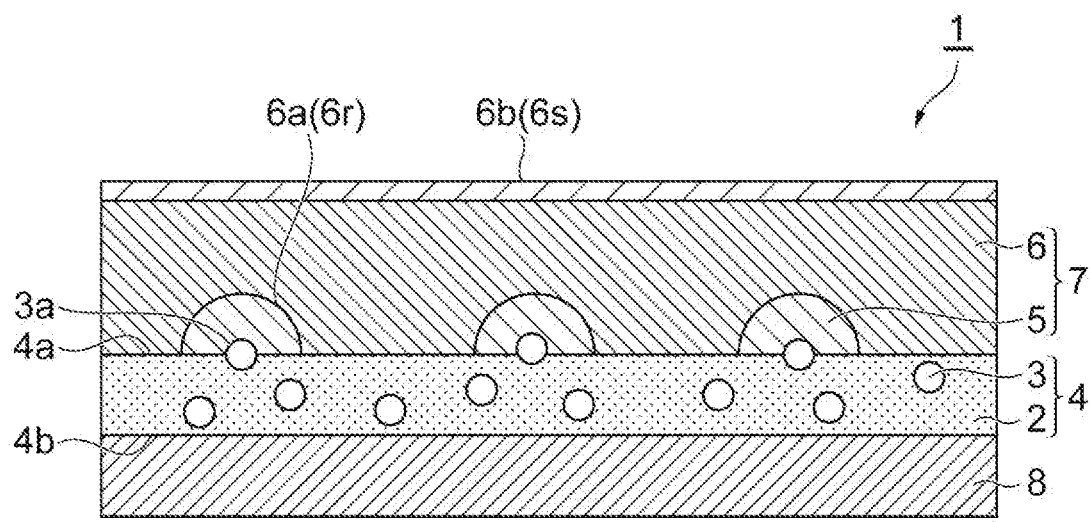
FIG. 2 is a schematic sectional view illustrating another embodiment of a sheet material.

FIG. 2 is a schematic sectional view illustrating another embodiment of a sheet material. As illustrated in FIG. 2, in a sheet material 1 according to the present embodiment, a main surface 6b, on the opposite side to first electroless plating films 5, of a second electroless plating film 6 may be a rough surface 6s. Accordingly, visibility of the sheet material 1 can be further improved.

The sheet material 1 according to the present embodiment can be manufactured by the following method, for example. That is, a method for manufacturing the sheet material 1 according to the present embodiment includes a step (first step) of forming a resin layer 4 containing a binder 2 and a plurality of catalyst particles 3 on a base material 8, at least some of the plurality of catalyst particles 3 respectively having exposure surfaces 3a exposed from one main surface 4a of the resin layer 4, the plurality of exposure surfaces 3a being scattered on the one main surface 4a of the resin layer 4, and the base material 8 being provided on the side of the other main surface 4b of the resin layer 4, a step (second step) of forming first electroless plating films 5 on the one main surface 4a of the resin layer 4 to respectively surround the plurality of exposure surfaces 3a, and a step (third step) of forming a second electroless plating film 6 to cover the first electroless plating films 5, a main surface 6a, on the side of the first electroless plating films 5, of the second electroless plating film 6 forming concave portions 6r, respectively, along surfaces of the first electroless plating films 5.

Examples of the method for forming the resin layer 4 on the base material 8 in the first step include a method for preparing a resin composition containing a binder and catalyst particles and applying the obtained resin composition onto a base material, followed by drying. Through the first step, a stacked body (first stacked body), including a base material and a resin layer containing a binder and a plurality of catalyst particles on the base material, in which at least some of the plurality of catalyst particles respectively have exposure surfaces exposed from one main surface of the resin layer and the plurality of exposure surfaces are scattered on the one main surface of the resin layer can be obtained. Although a mass ratio of the binder and the catalyst particles in the resin composition is not particularly limited, it is preferable that a mass ratio of the binder to the catalyst particles be 2:1 to 50:1, for example, from the viewpoint of more effectively suppressing a reflectance.

Examples of the method for forming the first electroless plating films 5 in the second step include a method for immersing the first stacked body obtained in the first step in a first electroless plating bath containing a predetermined metal, followed by rinsing or the like. Although a processing condition of the first electroless plating bath is not particularly limited, when a first electroless plating bath containing 0.1 to 2.0 grams of a predetermined metal per liter is used, for example, a processing temperature is 70 to 90° C., and a processing time period is 10 to 120 seconds. Through the second step, a stacked body (second stacked body) in which first electroless plating films are formed on the one main surface of the resin layer to respectively surround the plurality of exposure surfaces in the first stacked body can be obtained.

Examples of the method for forming the second electroless plating film 6 in the third step include a method for immersing the second stacked body obtained in the second step in a second electroless plating bath containing a predetermined metal, followed by rinsing or the like. Although a processing condition of the second electroless plating bath is not particularly limited, when a second electroless plating bath containing 1 to 5 grams of a predetermined metal per liter is used, for example, a processing temperature is 25 to 50° C., and a processing time period is 5 to 60 minutes. Through the third step, a sheet material in which a second electroless plating film is formed can be formed to cover the first electroless plating films in the second stacked body and for a main surface, on the side of the first electroless plating films, of the second electroless plating film to form concave portions, respectively, along the surfaces of the first electroless plating films A method for manufacturing the sheet material 1 according to the present embodiment may further include a step of roughing the main surface, on the opposite side to the first electroless plating films, of the second electroless plating film after the above-described third step. In the roughing, a rough surface may be formed by roughing processing or may be formed by plating processing, for example.

[First Metal Mesh]

A first metal mesh according to the present embodiment includes a resin layer containing a binder and a plurality of catalyst particles, an electroless plating film provided to faun a mesh-shaped pattern on the side of one main surface of the resin layer and including first electroless plating films and a second electroless plating film, and a base material provided on the side of the other main surface of the resin layer. At least some of the plurality of catalyst particles respectively have exposure surfaces exposed from the one main surface of the resin layer, the plurality of exposure surfaces are scattered on the one main surface of the resin layer, the first electroless plating films are provided on the one main surface of the resin layer to respectively surround the exposure surfaces of the plurality of catalyst particles, the second electroless plating film is provided to cover the first electroless plating films, and a main surface, on the side of the first electroless plating films, of the second electroless plating film forms concave portions, respectively, along surfaces of the first electroless plating films.

The first metal mesh can be manufactured by performing etching for the electroless plating film in the above-described sheet material according to the present embodiment, to form an electroless plating film having the mesh-shaped pattern, for example.

Figure 3A:
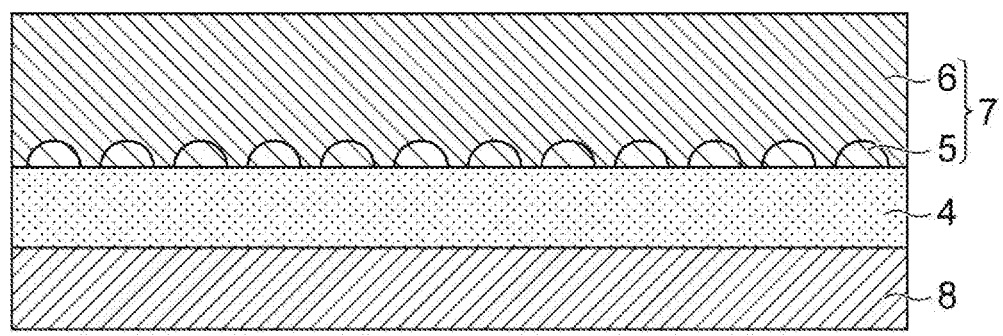
FIGS. 3A to 3C are schematic views illustrating an embodiment of steps of manufacturing a metal mesh.
Figure 3B:
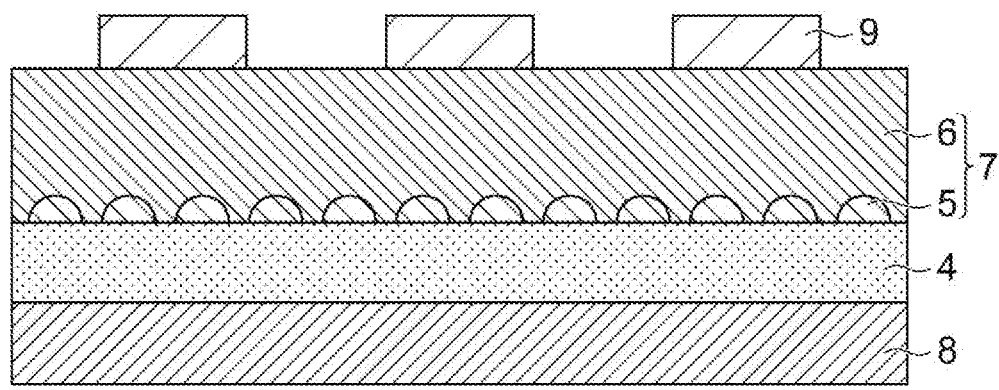
Figure 3C:
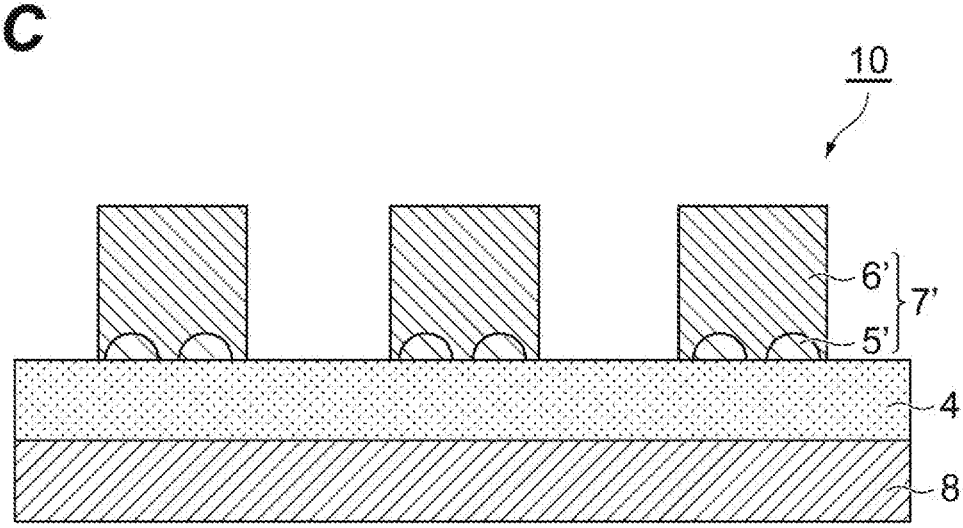

FIGS. 3A to 3C are schematic views illustrating an embodiment of steps of manufacturing a first metal mesh 10. As illustrated in FIGS. 3A to 3C, a sheet material 1 according to the present embodiment is first prepared (FIG. 3A), and a mesh-shaped resist pattern 9 is formed on a main surface, on the opposite side to a resin layer 4, of an electroless plating film 7 in the sheet material 1 (FIG. 3B). Although a method for forming the mesh-shaped resist pattern 9 is not particularly limited but a known method can be adopted, as needed, examples of the method include a method for forming a mesh-shaped resist pattern using a printing method, an ink jet method, a photolithography method, or the like and a method for forming a resist film, and then subjecting the resist film to pattern exposure and development to pattern the resist film into a mesh shape. Then, the electroless plating film 7 is etched using the resist pattern 9 as a mask, to form an electroless plating film 7' having a mesh-shaped pattern, and the resist pattern 9 is removed (FIG. 3C). Accordingly, the electroless plating film 7', including first electroless plating films 5' and a second electroless plating film 6', having a mesh-shaped pattern can be formed.

[Second Metal Mesh]

A second metal mesh according to the present embodiment includes a base material, a resin layer provided to form a mesh-shaped pattern on the base material and containing a binder and a plurality of catalyst particles, and an electroless plating film provided on the base material along the mesh-shaped pattern of the resin layer while covering the resin layer and including first electroless plating films and a second electroless plating film. At least some of a plurality of polypyrrole particles respectively have exposure surfaces exposed from a surface of the resin layer, the plurality of exposure surfaces are scattered on the surface of the resin layer, the first electroless plating films are provided on the surface of the resin layer to respectively surround the plurality of exposure surfaces of the catalyst particles, the second electroless plating film is provided to cover the first electroless plating films, and a main surface, on the side of the first electroless plating films, of the second electroless plating film fowls concave portions, respectively, along surfaces of the first electroless plating films.

The second metal mesh can be manufactured by the following method, for example.

Figure 4A:
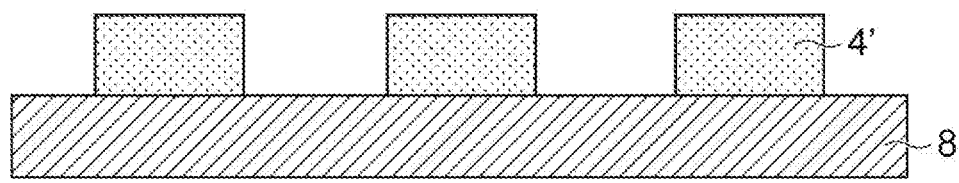
FIGS. 4A and 4B are schematic views illustrating another embodiment of steps of manufacturing a metal mesh.
Figure 4B:
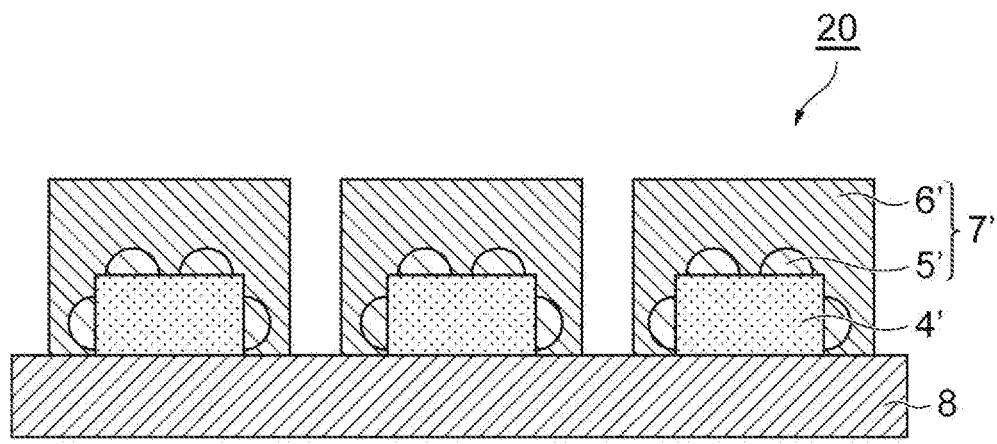

FIGS. 4A and 4B are schematic views illustrating an embodiment of steps of manufacturing a second metal mesh 20. As illustrated in FIGS. 4A and 4B, a resin layer 4' having a mesh-shaped pattern is first formed on a base material 8 (FIG. 4A). Although a method for forming the resin layer 4' having the mesh-shaped pattern is not particularly limited but a known method can be adopted, as needed, examples of the method include a method for forming the resin layer 4' having the mesh-shaped pattern using a printing method, an ink jet method, a photolithography method, or the like.

Then, first electroless plating films 5' are formed on a surface of the resin layer 4' to respectively surround a plurality of exposure surfaces. As a method for forming the first electroless plating films 5', a similar method to the method described in the above-described method for manufacturing the sheet material can be adopted.

When a second electroless plating film 6' is then foamed on the base material 8 to cover the resin layer 4' and the first electroless plating films 5', a second metal mesh can be formed (FIG. 4B). In the case, a main surface, on the side of the first electroless plating films 5', of the second electroless plating film 6' forms concave portions, respectively, along surfaces of the first electroless plating films 5'. As a method for forming the second electroless plating film 6', a similar method to the method described in the above-described method for manufacturing the sheet material can be adopted.

The sheet material and the metal mesh according to the present embodiment, described above, can be favorably used for a touch panel sensor of a smartphone, a tablet terminal, a PC (personal computer), or the like because a reflectance can be suppressed while an adhesive property between the base material and the plating film is high. The reflectance in the sheet material and the metal mesh which can be favorably used for the touch panel sensor is 20% or less, for example, preferably 15% or less, and more preferably 10% or less.

[Display Device]

When a light emitting element is mounted on a wiring substrate obtained from the sheet material according to the present embodiment, described above, a display device including the wiring substrate and the light emitting element can be manufactured.

[First Wiring Substrate]

A first wiring substrate according to the present embodiment includes a resin layer containing a binder and a plurality of catalyst particles, an electroless plating film provided to form a wiring pattern on the side of one main surface of the resin layer and including first electroless plating films and a second electroless plating film, and a base material provided on the side of the other main surface of the resin layer. At least some of the plurality of catalyst particles respectively have exposure surfaces exposed from the one main surface of the resin layer, the plurality of exposure surfaces are scattered on the one main surface of the resin layer, the first electroless plating films are provided on the one main surface of the resin layer to respectively surround the exposure surfaces of the plurality of catalyst particles, the second electroless plating film is provided to cover the first electroless plating films, and a main surface, on the side of the first electroless plating films, of the second electroless plating film forms concave portions, respectively, along surfaces of the first electroless plating films.

The first wiring substrate can be manufactured by performing etching for the electroless plating film in the above-described sheet material according to the present embodiment, to form an electroless plating film having a wiring pattern, for example.

[Second Wiring Substrate]

A second wiring substrate according to the present embodiment includes a base material, a resin layer provided to form a wiring pattern on the base material and containing a binder and a plurality of catalyst particles, and an electroless plating film provided on the base material along the wiring pattern of the resin layer while covering the resin layer and including first electroless plating films and a second electroless plating film. At least some of a plurality of polypyrrole particles respectively have exposure surfaces exposed from a surface of the resin layer, the plurality of exposure surfaces are scattered on the surface of the resin layer, the first electroless plating films are provided on the surface of the resin layer to respectively surround the plurality of exposure surfaces of the catalyst particles, the second electroless plating film is provided to cover the first electroless plating films, and a main surface, on the side of the first electroless plating films, of the second electroless plating film forms concave portions, respectively, along surfaces of the first electroless plating films.

The second wiring substrate can be manufactured by a similar method to the above-described method for manufacturing the second metal mesh, for example.

In mounting of a light emitting element, the light emitting element may be mounted on the wiring substrate with a connection section interposed therebetween, for example. In this case, the connection section may be provided on a main surface, on the opposite side to the resin layer, of the electroless plating film on the wiring substrate, and the light emitting element may be provided on a main surface, on the opposite side to the electroless plating film, of the connection section. In the above-described wiring substrate according to the present embodiment, an adhesive property between the base material and the plating film is high. Accordingly, a display device including the wiring substrate can be used as a flexible display device (display) which is manufactured to be as thin as a cloth or a sheet and can be folded and rounded. The flexible display device can be made small in size and lightweight, and its accommodability and designability can be improved. A preferred embodiment of the display device will be specifically described below.

A first display device according to the present embodiment includes a connection section provided on a main surface, on the opposite side to the resin layer, of the electroless plating film, and a light emitting element provided on a main surface, on the opposite side to the electroless plating film, of the connection section in the above-described first wiring substrate.

Figure 5A:
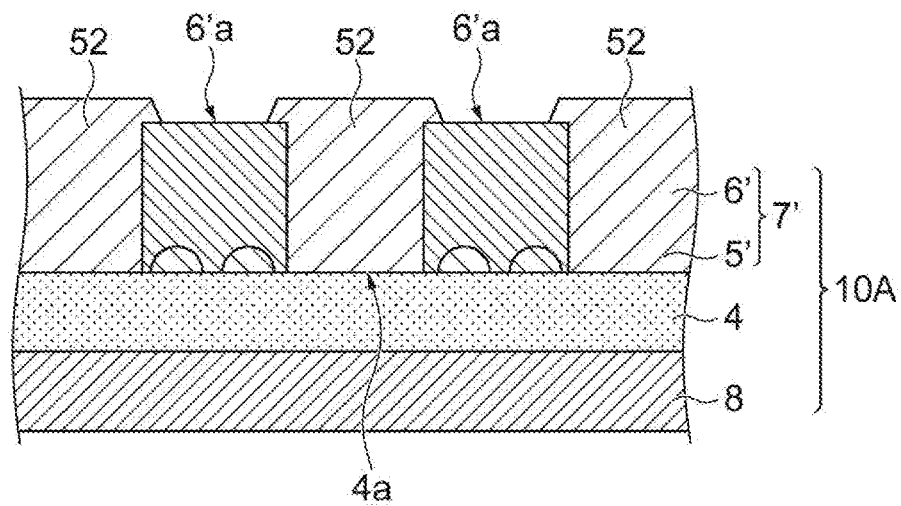
FIGS. 5A to 5C are schematic views illustrating an embodiment of steps of manufacturing a display device.
Figure 5B:
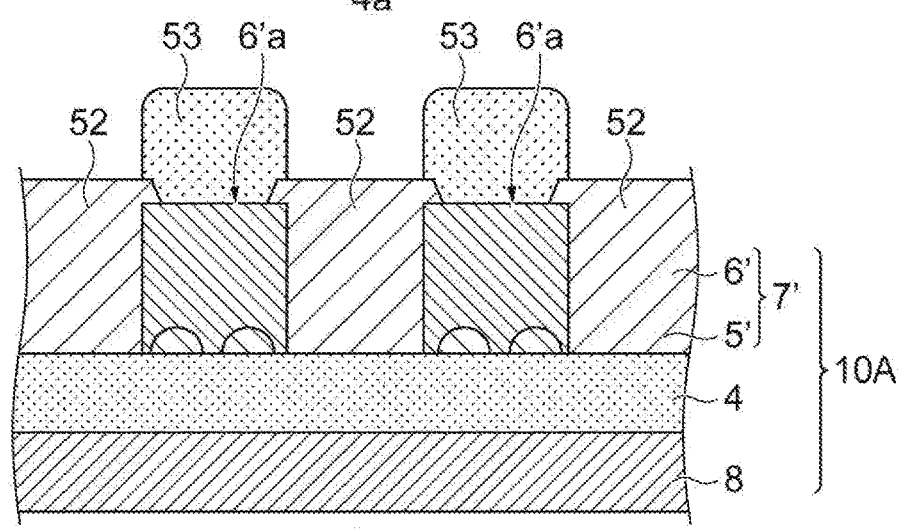
Figure 5C:
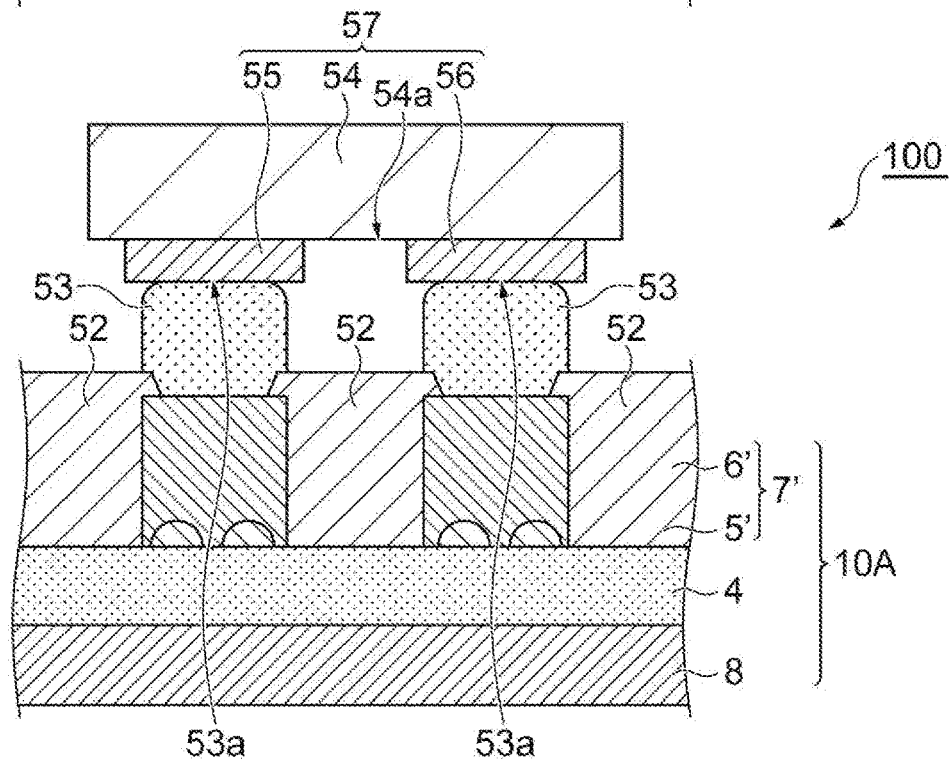

FIGS. 5A to 5C are schematic views illustrating an embodiment of steps of manufacturing a first display device 100. In a method illustrated in FIGS. 5A to 5C, an insulating layer 52 is first formed on a main surface 4a, on the opposite side to a base material 8, of a resin layer 4 (a surface on which an electroless plating film 7' is not formed) and an upper surface 6'a of a second electroless plating film 6' in the electroless plating film 7', i.e., a surface on which a connection section 53, described below, is not formed in a first wiring substrate 10A, as illustrated in FIG. 5A. The insulating layer 52 may be formed to cover the main surface 4a of the resin layer 4 and a part of the second electroless plating film 6' (e.g., an end of the second electroless plating film 6').

The insulating layer 52 preferably contains resin. Examples of the resin composing the insulating layer 52 may include silicone resin and epoxy resin. The thickness of the insulating layer 52 may be 0.1 to 5.0 μm.

As illustrated in FIG. 5B, the connection section 53 is then formed on a surface, on the opposite side to the resin layer 4, of the second electroless plating film 6', i.e., the upper surface 6'a on which the insulating layer 52 is not formed.

The connection section 53 may be formed by using a micro-ball consisting of a solder alloy on the upper surface 6'a or may be formed by printing a paste consisting of a solder alloy. The connection section 53 may be formed by an electroless plating method for making a metal plating grow from the second electroless plating film 6'. If the connection section 53 is formed by an electroless plating method, the connection section 53 may contain tin, silver, copper, bismuth, indium, or the like as a constituent material, and may contain an alloy of two or more of the materials. The size of the connection section 53 may be set, as needed, if it is a size in which an electrode in a light emitting element, described below, can contact the connection section 53.

As illustrated in FIG. 5C, a light emitting element 57 including a light emitting section 54, a positive electrode 55 provided on one main surface 54a of the light emitting section 54, and a negative electrode 56 provided a predetermined distance away from the positive electrode 55 is then prepared, and the positive electrode 55 and the negative electrode 56 in the light emitting element 57 are connected to the second electroless plating film 6' in the first wiring substrate 10A with the connection section 53 interposed therebetween, to mount the light emitting element 57 on the first wiring substrate 10A. In this step, the light emitting element 57 may be connected to the first wiring substrate 10A by making the positive electrode 55 and the negative electrode 56 in the light emitting element 57 contact a surface 53a, on the opposite side to a surface contacting the insulating layer 52, of the connection section 53. Accordingly, a first display device 100 in which the light emitting element 57 is mounted on the first wiring substrate 10A can be obtained.

A second display device according to the present embodiment further includes a connection section provided on a main surface, on the opposite side to a resin layer, of an electroless plating film and a light emitting element provided on a main surface, on the opposite side to the electroless plating film, of the connection section in the above-described second wiring substrate.

Figure 6A:
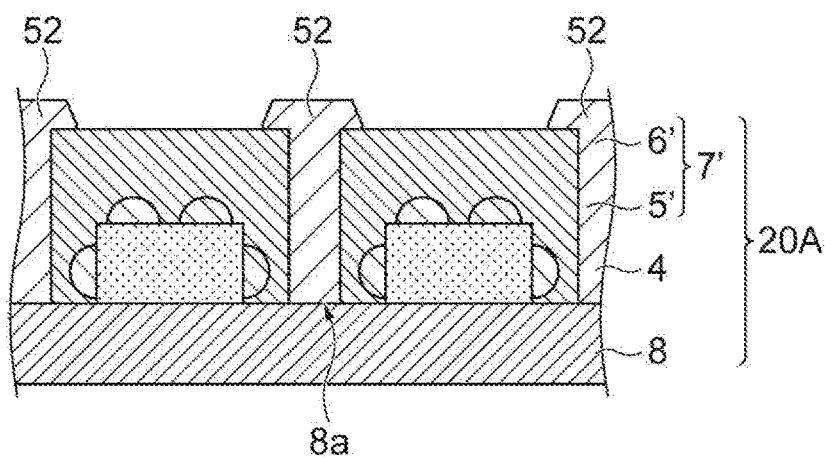
FIGS. 6A to 6C are schematic views illustrating another embodiment of steps of manufacturing a display device.
Figure 6B:
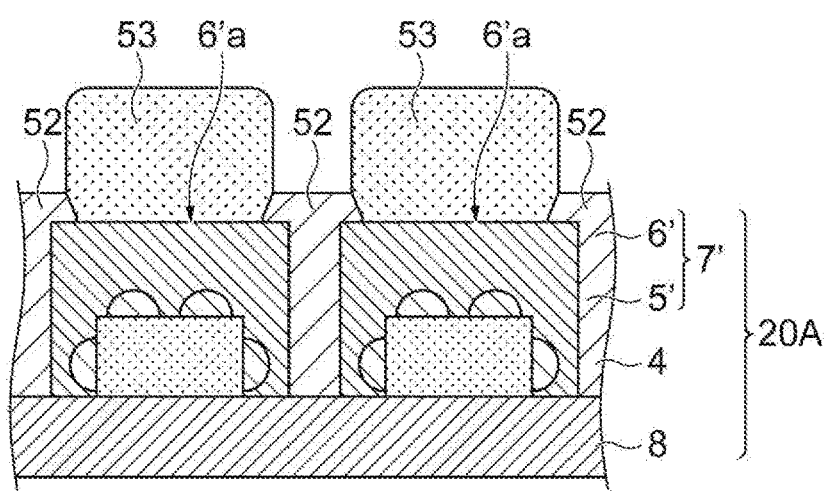
Figure 6C:
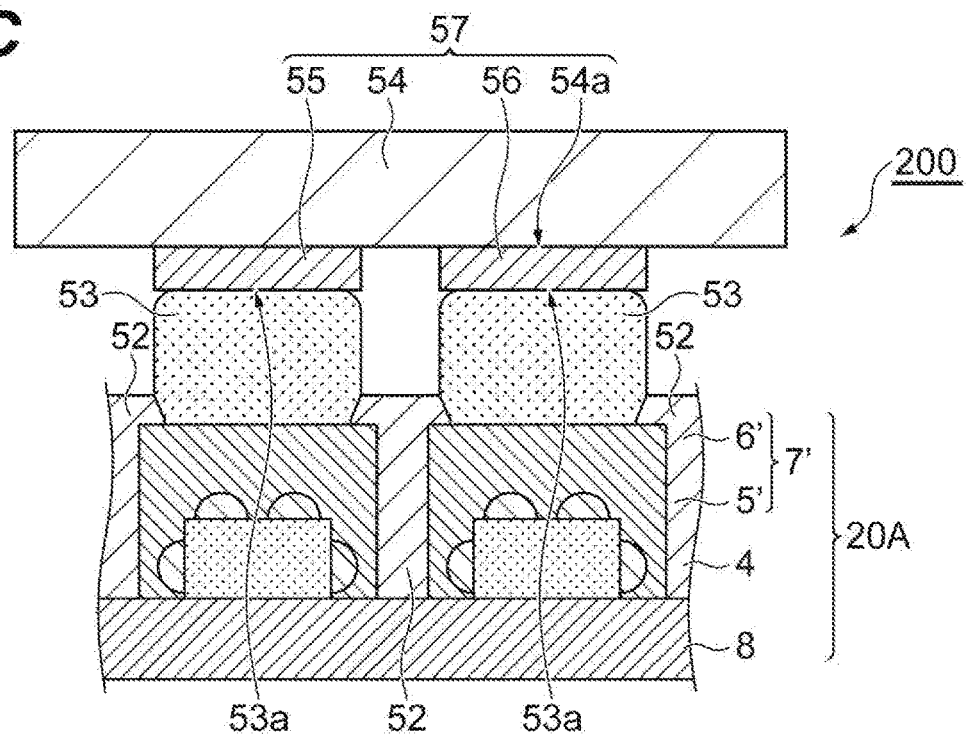

FIGS. 6A to 6C are schematic views illustrating an embodiment of steps of manufacturing a second display device 200. In a method illustrated in FIGS. 6A to 6C, an insulating layer 52 is first formed on a main surface 8a, on the side on which a resin layer 4 is formed, of a base material 8 (a surface on which an electroless plating film 7' is not formed) and an upper surface 6'a of a second electroless plating film 6' in the electroless plating film 7', i.e., a surface on which a connection section 53 is not formed in a second wiring substrate 20A, as illustrated in FIG. 6A. The insulating layer 52 may be formed to cover the main surface 8a of the base material 8 and a part of the second electroless plating film 6' (e.g., an end of the second electroless plating film 6'). A material for and a size of the insulating layer 52 may be similar to the method for and the size of the insulating layer 52 in the above-described first display device.

As illustrated in FIG. 6B, the connection section 53 is then formed on a surface, on the opposite side to the resin layer 4, of the second electroless plating film 6', i.e., the upper surface 6'a on which the insulating layer 52 is not formed. A method for forming, a material for, and a size of the connection section 53 may be similar to the method for forming, the material for, and the size of the connection section 53 in the above-described first display device.

As illustrated in FIG. 6C, a positive electrode 55 and a negative electrode 56 in a light emitting element 57 are connected to the second electroless plating film 6' in the second wiring substrate 20A with the connection section 53 interposed therebetween, to mount the light emitting element 57 on the second wiring substrate 20A. In this step, the light emitting element 57 may be connected to the second wiring substrate 20A by making the positive electrode 55 and the negative electrode 56 in the light emitting element 57 contact a surface 53a, on the opposite side to a surface contacting the insulating layer 52, of the connection section 53. Accordingly, the second display device 200 in which the light emitting element 57 is mounted on the second wiring substrate 20A can be obtained.

Figure 7:
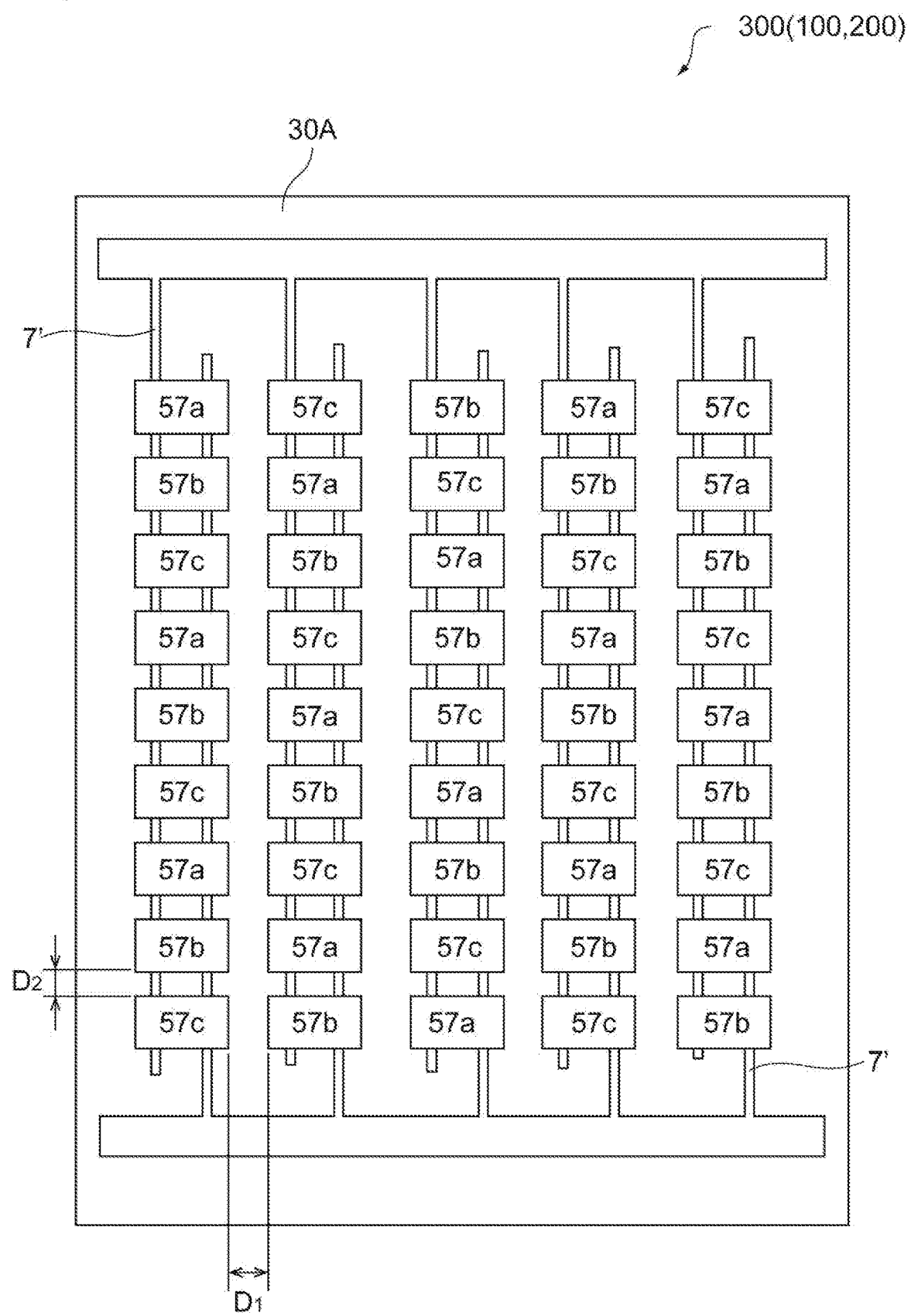
FIG. 7 is a plan view schematically illustrating a principal part of the display device obtained by methods illustrated in FIGS. 5A to 5C and FIGS. 6A to 6C.

FIG. 7 is a plan view schematically illustrating a principal part of a display device 300 (the first display device 100 or the second display device 200) obtained by the methods illustrated in FIGS. 5A to 5C and 6A to 6C. As illustrated in FIG. 7, in the display device 300, a light emitting element 57 is mounted on two electroless plating films 7' in a wiring substrate 30A (the first wiring substrate 10A or the second wiring substrate 20A) a predetermined distance away from each other. The light emitting element 57 may include a light emitting element 57a including a red light emitting section, a light emitting element 57b including a green light emitting section, and a light emitting element 57c including a blue light emitting section, and the light emitting elements 57a, 57b, and 57c may be arranged in any order. As a distance between the adjacent light emitting elements 57, a distance Dl in a width direction between the electroless plating films 7' may be 400 µm or less, and a distance D2 in an extension direction between the electroless plating films 7' may be 200 µm or less.

A method for manufacturing the above-described display device may include a step of providing a sealing section (not illustrated) covering an exposed portion of the light emitting element. The sealing section may be formed of resin such as silicone resin or epoxy resin.

EXAMPLES

Although the present invention will be specifically described below by giving examples and comparative examples, the present invention is not limited to the following examples.

[Production of Sheet Material]

Example 1

A resin composition containing 20% by mass of palladium particles and isocyanate resin was prepared. The obtained resin composition was applied onto a PET film (trade name "COSMOSHINE A4100" manufactured by TOYOBO CO., LTD.), followed by drying, to obtain a first stacked body including a resin layer having palladium particles exposed to its surface in a thickness of 60 µm on the PET film. The first stacked body was immersed in an electroless plating bath containing 0.5 grams of nickel ions per liter, and electroless plating processing was performed for 20 seconds with the plating bath set to a temperature of 82° C., to obtain a second stacked body having first electroless plating films each having an uneven surface formed therein. Then, the second stacked body was immersed in an electroless plating bath containing 3.0 grams of copper ions per liter, and electroless plating processing was performed for 45 minutes with the plating bath set to a temperature of 38° C., to produce a sheet material in which a second electroless plating film was formed on the respective uneven surfaces of the first electroless plating films. The thickness of the second electroless plating film was 1 µm, and concave portions, respectively, along the surfaces of the first electroless plating films were formed.

Example 2

A similar operation to that in the example 1 was performed except that a time period during which the first stacked body was immersed in the electroless plating bath containing nickel ions was set to 30 seconds, to obtain a sheet material.

Example 3

A similar operation to that in the example 1 was performed except that a time period during which the first stacked body was immersed in the electroless plating bath containing nickel ions was set to 40 seconds, to obtain a sheet material.

Example 4

A similar operation to that in the example 1 was performed except that a time period during which the first stacked body was immersed in the electroless plating bath containing nickel ions was set to 50 seconds, to obtain a sheet material.

Example 5

A similar operation to that in the example 1 was performed except that a time period during which the first stacked body was immersed in the electroless plating bath containing nickel ions was set to 60 seconds, to obtain a sheet material.

Example 6

A similar operation to that in the example 1 was performed except that a time period during which the first stacked body was immersed in the electroless plating bath containing nickel ions was set to 90 seconds, to obtain a sheet material.

Example 7

A similar operation to that in the example 1 was performed except that a time period during which the first stacked body was immersed in the electroless plating bath containing nickel ions was set to 120 seconds, to obtain a sheet material.

Comparative Example 1

Palladium was film-formed to have a thickness of 20 nm using a sputtering method on a PET film (trade name "COSMOSHINE A4100" manufactured by TOYOBO CO., LTD.), to obtain a stacked body. Then, the obtained stacked body was immersed in an electroless plating bath containing 0.5 grams of nickel ions per liter, and electroless plating processing was performed for 20 seconds with the plating bath set to a temperature of 82° C., to obtain a second stacked body having first electroless plating films each having a smooth surface foamed therein. Then, the second stacked body was immersed in a solution containing 0.1 grams of palladium ions per liter, followed by rinsing, and was then immersed in an electroless plating bath containing 3 grams of copper ions per liter, and electroless plating processing was performed for 45 minutes with the plating bath set to a temperature of 38° C., to obtain a sheet material in which a second electroless plating film containing copper was formed on the respective surfaces of the first electroless plating films containing nickel. The thickness of the second electroless plating film containing copper was 1 µm.

Comparative Example 2

Nickel was film-formed to have a thickness of 20 nm using a sputtering method on a PET film (trade name "COSMOSHINE A4100" manufactured by TOYOBO CO., LTD.), to obtain a second stacked body having films each having a smooth surface formed therein. Then, the second stacked body was immersed in a solution containing 0.1 grams of palladium ions per liter, followed by rinsing, and was then immersed in a solution containing 10 grams of a hypophosphorous acid per liter, followed by rinsing. Then, the second stacked body was immersed in an electroless plating bath containing 3 grams of copper ions per liter, and electroless plating processing was performed for 45 minutes with the plating bath set to a temperature of 38° C., to obtain a sheet material in which the second electroless plating film containing copper was formed on the respective surfaces of the films containing nickel. The thickness of the electroless plating film was 1 µm.

Comparative Example 3

A PET film (trade name "COSMOSHINE A4100" manufactured by TOYOBO CO., LTD.) was immersed in a colloidal Sn—Pd solution for five minutes at a temperature of 25° C., followed by rinsing, and was then immersed in an electroless plating bath containing 0.5 grams of nickel ions per liter, and electroless plating processing was performed for 20 seconds with the plating bath set to a temperature of 82° C., to obtain a second stacked body having first electroless plating films each having an uneven surface formed therein. Then, the second stacked body was immersed in a solution containing 0.1 grams of palladium ions per liter, followed by rinsing, and was then immersed in an electroless plating bath containing 3 grams of copper ions per liter, and electroless plating processing was performed for 45 minutes with the plating bath set to a temperature of 38° C., to obtain a sheet material in which a second electroless plating film containing copper was formed on the respective uneven surfaces of the films containing nickel.

[Evaluation of Sheet Material]
(Measurement of Respective Longest Diameters and Area Ratio of First Electroless Plating Films)

The respective longest diameters and an area ratio of the first electroless plating films in each of the second stacked bodies obtained in the above-described examples and comparative examples were measured using image analysis of an SEM picture. The measurement was performed by observing each of the second stacked bodies at a magnification of 200000 times in a field of view which is 500 µm in length and 60 µm in width, to calculate an average value of the respective longest diameters of the first electroless plating films and the area ratio of the first electroless plating films to the field of view. Note that the respective surface of the films in the second stacked body produced in each of the comparative examples 1 and 2 was smooth, and thus the longest diameters thereof could not be measured. A measurement result is shown in Table 1.

(Measurement of Reflectance)

A reflectance of light from the side of the PET film in the sheet material obtained in each of the examples and the comparative examples was measured according to a method conforming to JIS K 8729 using Spectrophotometer CM-5 (product name, manufactured by KONICA MINOLTA, INC.). A measurement result is shown in Table 1. If the reflectance is 20% or less, the sheet material can be said to be a good sheet material in which a reflectance is kept low.

[Production of Metal Mesh]

A mesh-shaped resist pattern having 5 µm lines (L) and 10 µm spaces (S) was formed by photography on the electroless plating film in the sheet material obtained in each of the examples and the comparative examples. Then, the resist pattern was immersed in a 5% sodium persulfate solution, and was etched for five minutes at a temperature of 25° C., to remove a resist, thereby producing a metal mesh.

[Evaluation of Metal Mesh]
(Evaluation of Adhesive Property)

The obtained metal mesh was wound around a stainless steel rod having a diameter of 1 mm, to evaluate an adhesive property of the electroless plating film according to the following evaluation criteria.

The result is shown in Table 1.

A: Peeling of the plating film was not recognized even after the metal mesh was wounded 500 times.

B: Peeling of the plating film was recognized by winding the metal mesh less than 500 times.

(Evaluation of Etching Property)

The presence or absence of disconnection of a line by etching was visually observed, and an etching property was evaluated according to the following evaluation criteria. The result is shown in Table 1.

A: Disconnection of the line was not recognized when etching was performed.

B: Disconnection of the line was recognized when etching was performed.

TABLE 1

|  | Example 1 | Example 2 | Example 3 | Example 4 | Example 5 | Example 6 | Example 7 | Comparative example 1 | Comparative example 2 | Comparative example 3 |
|---|---|---|---|---|---|---|---|---|---|---|
| Average value of longest diameters (nm) | 19 | 21 | 26 | 29 | 36 | 59 | 89 | Smooth | Smooth | 120 |
| Area ratio (%) | 86.0 | 91.0 | 94.0 | 95.0 | 97.0 | 99.0 | 99.0 | 100 | 100 | 50-80 |
| Reflectance (%) | 19.0 | 9.5 | 4.0 | 7.0 | 9.2 | 11.5 | 14.2 | 31.0 | 25.0 | 23.0 |
| Adhesive property | A | A | A | A | A | A | A | A | A | B |
| Etching property | A | A | A | A | A | A | A | B | A | A |

As can be seen from respective results of the examples 1 to 7, in the sheet material according to the present invention, the reflectance could be kept low while the adhesive property between the base material and the plating film could be enhanced. Further, the disconnection of the line was not recognized when etching was performed, thereby indicating that the sheet material had an excellent etching property.

On the other hand, in the comparative example 1 in which the palladium film was provided on the PET film using the sputtering method, and the nickel plating films were then formed and the comparative example 2 in which the nickel films were directly formed on the PET film using the sputtering method, almost all of the films containing nickel formed a continuous film having a smooth surface, whereby the reflectance could not be kept low. Further, when the films were provided, like in the comparative example 1, the copper plating film was preferentially etched, thereby indicating that the line was easily disconnected. In the comparative example 3 in which the PET film was immersed in the colloidal Sn—Pd solution to make the palladium particles adhere to the PET film and then form the nickel plating films, the plating films were formed without using a resin layer. Accordingly, the palladium particles did not sufficiently adhere to the PET film, whereby the adhesive property could not be ensured. The plating film formed in a portion to which the palladium particles did not adhere formed a continuous film having a smooth surface, whereby the reflectance could not be kept low.

What is claimed is:

1. A method for manufacturing a display device comprising mounting a light emitting element on a wiring substrate, the wiring substrate comprising:
   a resin layer comprising a binder and a plurality of catalyst particles;
   an electroless plating film provided to form a wiring pattern on a side of one main surface of the resin layer and comprising first electroless plating films and a second electroless plating film; and
   a base material provided on a side of an other main surface of the resin layer, wherein:
   at least some of the plurality of catalyst particles respectively have exposure surfaces exposed from the one main surface of the resin layer, and the exposure surfaces are scattered on the one main surface of the resin layer,
   the first electroless plating films are provided on the one main surface of the resin layer to respectively surround the exposure surfaces of the catalyst particles,
   the second electroless plating film is provided to cover the first electroless plating films, and a main surface of the second electroless plating film on a side of the first electroless plating films forms concave portions, respectively, along surfaces of the first electroless plating films, and
   the mounting comprises:
      forming a connection section on a main surface of the electroless plating film on an opposite side to the resin layer in the wiring substrate, and
      connecting the light emitting element to the electroless plating film with the connection section interposed therebetween.

2. A display device comprising:
   a wiring substrate comprising:
      a resin layer comprising a binder and a plurality of catalyst particles;
      an electroless plating film provided to form a wiring pattern on a side of one main surface of the resin layer and comprising first electroless plating films and a second electroless plating film; and
      a base material provided on a side of an other main surface of the resin layer;
   a connection section provided on a main surface of the electroless plating film on an opposite side to the resin layer in the wiring substrate; and
   a light emitting element mounted on and connected to the wiring substrate with the connection section interposed therebetween
   wherein:
      at least some of the plurality of catalyst particles respectively have exposure surfaces exposed from the one main surface of the resin layer, and the exposure surfaces are scattered on the one main surface of the resin layer,
      the first electroless plating films are provided on the one main surface of the resin layer to respectively surround the exposure surfaces of the catalyst particles, and
      the second electroless plating film is provided to cover the first electroless plating films, and a main surface of the second electroless plating film on a side of the first electroless plating films forms concave portions, respectively, along surfaces of the first electroless plating films.

* * * * *